United States Patent
Hosaka

(10) Patent No.: US 11,486,924 B2
(45) Date of Patent: Nov. 1, 2022

(54) INSPECTION APPARATUS

(71) Applicant: TOKYO ELECTRON LIMITED, Tokyo (JP)

(72) Inventor: Hiroki Hosaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/190,089

(22) Filed: Mar. 2, 2021

(65) Prior Publication Data

US 2021/0278456 A1 Sep. 9, 2021

(30) Foreign Application Priority Data

Mar. 3, 2020 (JP) .............................. JP2020-036109

(51) Int. Cl.
| | |
|---|---|
| *G01R 31/00* | (2006.01) |
| *G01R 31/28* | (2006.01) |
| *G01R 1/04* | (2006.01) |
| *G01R 1/067* | (2006.01) |
| *G01R 1/073* | (2006.01) |
| *H01L 21/67* | (2006.01) |
| *H01L 21/68* | (2006.01) |

(52) U.S. Cl.
CPC ..... *G01R 31/2889* (2013.01); *G01R 1/07342* (2013.01); *G01R 31/2893* (2013.01)

(58) Field of Classification Search
CPC .... G01R 31/00; G01R 31/28; G01R 31/2889; G01R 31/2893; G01R 1/067; G01R 1/073; G01R 1/07342; G01R 1/04; H01L 21/67; H01L 21/68
See application file for complete search history.

(56) References Cited

U.S. PATENT DOCUMENTS

| | | | |
|---|---|---|---|
| 9,581,641 B2 * | 2/2017 | Yamada | G01R 31/2891 |
| 10,510,574 B2 | 12/2019 | Tamura | |
| 2016/0091562 A1 * | 3/2016 | Hosaka | G01R 31/2893 324/757.01 |

FOREIGN PATENT DOCUMENTS

| | | |
|---|---|---|
| JP | 7-107546 B2 | 11/1995 |
| JP | 2018-22813 A | 2/2018 |
| JP | 2019-21804 A | 2/2019 |
| KR | 10-2010-0085396 A | 7/2010 |
| KR | 10-2016-0022775 A | 3/2016 |

* cited by examiner

*Primary Examiner* — Neel D Shah
(74) *Attorney, Agent, or Firm* — Nath, Goldberg & Meyer; Jerald L. Meyer; Tanya E. Harkins

(57) ABSTRACT

An inspection apparatus includes a load port area in which a carrier accommodation chamber for accommodating a carrier that receives an inspection object is disposed; an inspection area in which a plurality of probe cards are respectively disposed under a plurality of inspection devices, and in which the probe card is pressed against an electronic device of the inspection object on a chuck top to inspect the electronic device; a transfer area in which a transfer mechanism transfers the inspection object onto the chuck top; and a plurality of probe card accommodation devices disposed in at least one of the load port area or the inspection area, each probe card accommodation device being capable of accommodating the probe card, and a number of the probe card accommodation devices being equal to or greater than a number of the probe cards.

6 Claims, 4 Drawing Sheets

US 11,486,924 B2

INSPECTION APPARATUS

CROSS-REFERENCE TO RELATED APPLICATION

This application is based upon and claims the benefit of priority from Japanese Patent Application No. 2020-036109, filed on Mar. 3, 2020, the entire contents of which are incorporated herein by reference.

TECHNICAL FIELD

The present disclosure relates to an inspection apparatus.

BACKGROUND

Patent Document 1 discloses an inspection system including an inspection area that has an inspection part. The inspection part includes a plurality of inspection devices that are arranged in a vertical direction in multiple stages and are arranged in one horizontal direction. An inspection device has a tester fir performing electrical inspection of an inspection object and a probe card interposed between the tester and the inspection object, and performs the electrical inspection of the inspection object. The inspection system further includes an arrangement device, which is provided on one end of the one horizontal direction of the inspection part and on which an accommodation container for the inspection object is disposed, and a loader area having a loader for transporting the inspection object between the accommodation container and the inspection area.

The inspection area further includes a plurality of transfer paths provided near each stage of the inspection part and extending in the one horizontal direction, and a plurality of transfer mechanisms provided to be movable along each of the transfer paths so as to transfer an inspection object loaded from the loader to and from the inspection device at each stage. Further, a buffer for temporarily placing the inspection object is provided in the loader area and the buffer has a plurality of inspection object stages.

PRIOR ART DOCUMENT

Patent Document

Patent Document 1: Japanese laid-open publication No. 2019-021804

SUMMARY

According to one embodiment of the present disclosure, an inspection apparatus includes: a load port area in which a carrier accommodation chamber for accommodating a carrier that receives an inspection object is disposed; an inspection area in which a plurality of probe cards are respectively disposed under a plurality of inspection devices, and in which the probe card is pressed against an electronic device of the inspection object on a chuck top to inspect the electronic device; a transfer area in which a transfer mechanism transfers the inspection object onto the chuck top, the transfer area being disposed between the load port area and the inspection area in a plan view; and a plurality of probe card accommodation devices disposed in at least one of the load port area or the inspection area, each probe card accommodation device being capable of accommodating the probe card, and a number of the probe card accommodation devices being equal to or greater than a number of the probe cards

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
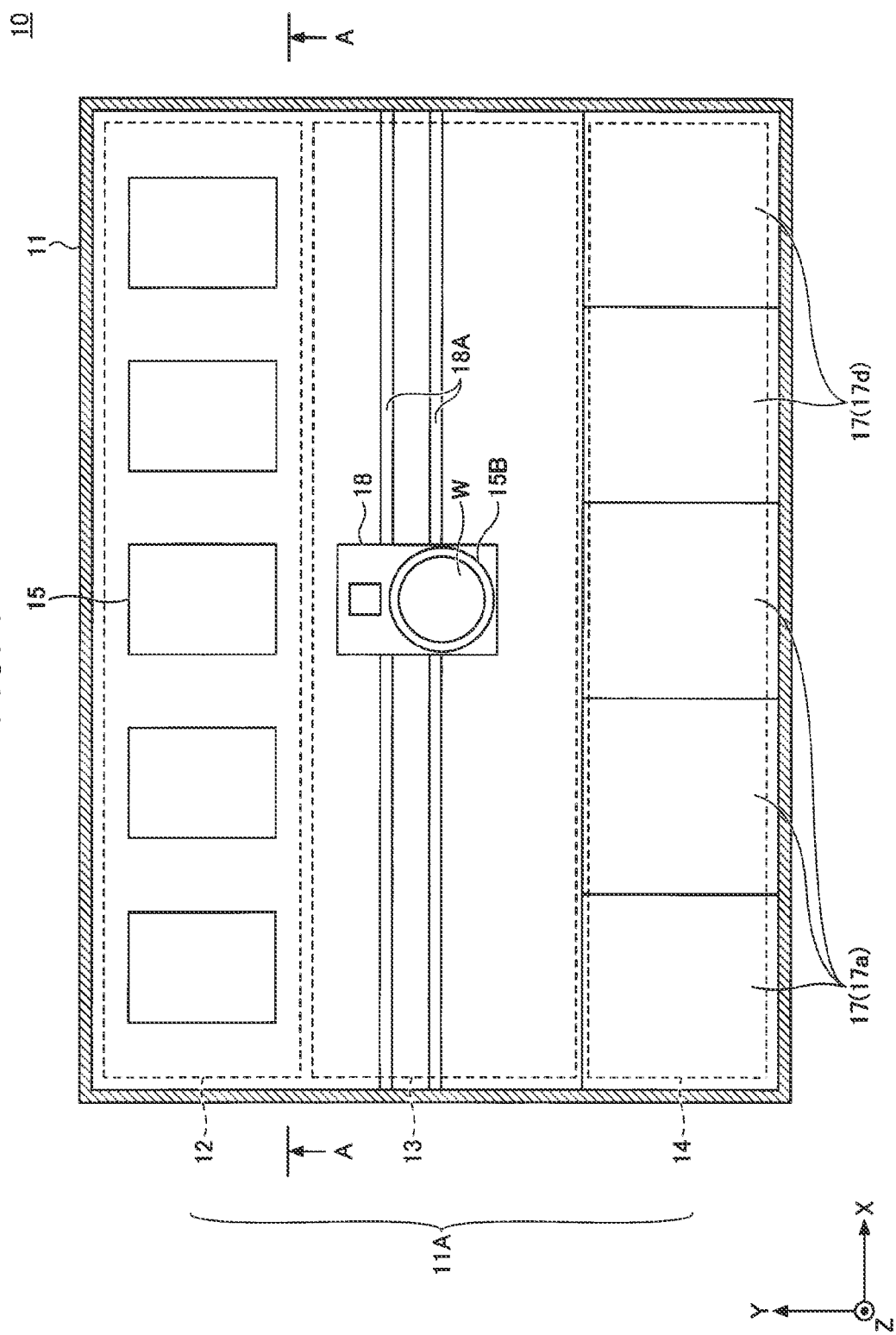
FIG. 1 shows a cross-sectional view of an example of an inspection apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, a mode for carrying out the present disclosure will be described with reference to the drawings. Throughout the present disclosure and the drawings, substantially the same parts and portions may be denoted by the same reference numerals and therefore, explanation thereof may not be repeated. In the following, descriptions will be made using the vertical direction or vertical relationship in the drawings, but it does not represent the universal vertical direction or vertical relationship.

First Embodiment

Figure 2:
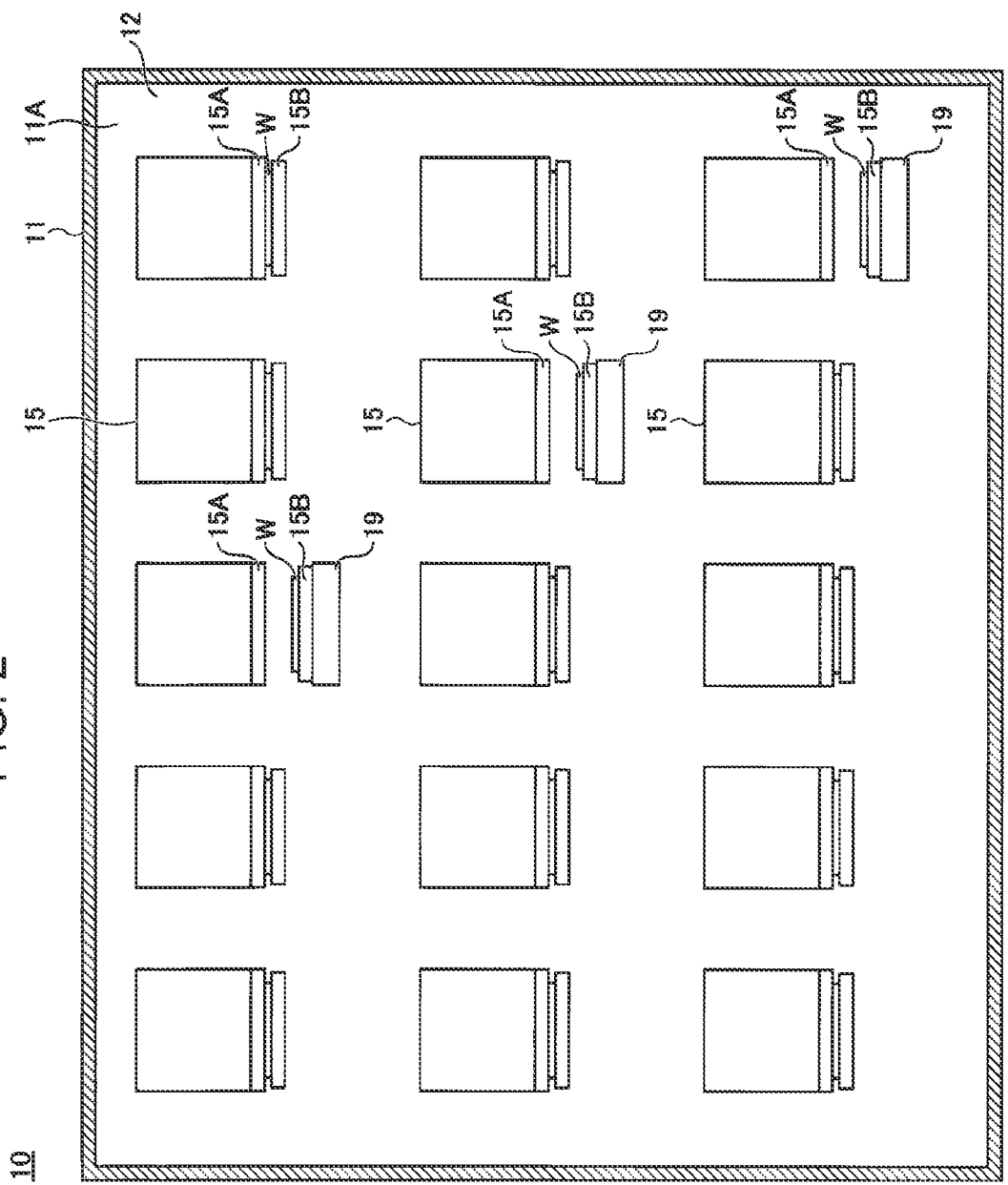
FIG. 2 depicts an example of a cross-sectional view of the entire inspection apparatus when viewed in the direction of arrows A-A in FIG. 1.

FIG. 1 shows a cross-sectional view of an example of an inspection apparatus 10 according to an embodiment. FIG. 2 depicts an example of a cross-sectional view of the entire inspection apparatus 10 when viewed in the direction of arrows A-A in FIG. 1. In the following, an XYZ coordinate system, which is a Cartesian coordinate system, will be defined and described. The XY plane is a horizontal plane, and the Z direction is a vertical direction. The X direction is an example of a first axial direction, and the Y direction is an example of a second axial direction.

As shown in FIGS. 1 and 2, the inspection apparatus 10 includes a housing 11. An internal space of the housing 11 is an inspection room 11A. The inspection room 11A has an inspection area 12, a transfer area 13, and a load port area 14.

In FIGS. 1 and 2, walls (walls substantially parallel to the XZ plane) partitioning the inspection area 2, the transfer area 13, and the load port area 14, or openings formed in the walls, etc. are omitted.

The inspection area 12 is an area where electrical characteristics of an electronic device formed on a wafer W, which is an example of an inspection object, are inspected, and where a plurality of testers 15 for wafer inspection are disposed. Each of the testers 15 is an example of an inspection device. As an example, in the inspection area 12, five testers 15 are disposed in the X direction and three stages are provided in the vertical direction. The configuration shown in FIG. 1 corresponds to a portion including the testers 15 at a second stage. Further, in the inspection area 12, multiple testers 15 may be disposed in the X direction and in multiple stages in the vertical direction.

The transfer area 13 is an area provided between the inspection area 12 and the load port area 14. A rail 18A for guiding a transfer stage 18 in the X direction is provided in the transfer area 13. The transfer stage 18 will be described later.

The load port area 14 is partitioned into a plurality of accommodation spaces 17, As an example, the plurality of accommodation spaces 17 are divided into five spaces in the X direction and three stages in the vertical direction. FIG. 1 shows five accommodation spaces 17 located in the middle stage of the three stages. Three ports 17a for accommodating FOUPs, which are containers for receiving a plurality of wafers W, are respectively disposed in three of the five accommodating spaces 17 in the middle stage. In the remaining two accommodation spaces 17, controllers 17d for controlling an operation of each device of the inspection apparatus 10 are respectively disposed. A FOUP is an example of a carrier, and a port 17a is an example of a carrier accommodation chamber.

A pogo frame 15A for holding a probe card (not shown) is provided under each tester 15. The pogo frame 15A is fixed to the housing 11. The pogo frame 15A has pogo pins that respectively contact terminals of the electronic device of the wafer W. The terminals of the electronic device of the wafer W are electrically connected to the tester 15 via the pogo frame 15A.

A chuck top 15B is attracted to the pogo frame 15A by a vacuum suction mechanism (not shown) in a state where position alignment is performed by an aligner 19 (see FIG. 2). When the chuck top 15B is attracted onto the pogo frame 15A, a probe of the probe card is pressed against the terminals of the electronic device of the wafer W. Further, in FIG. 1, the aligner 19 is beneath any one of the five testers 15, but illustration thereof is omitted.

One camera (not shown) is provided for five testers 15 at each stage. The camera can move in the X direction along the rail (not shown) at each stage. At each stage, a position of the wafer W or the like held on the upper surface of the chuck top 15B is photographed by the camera, and image data acquired by the camera is used when the wafer W is aligned by the aligner 19.

The chuck top 15B may have a heating mechanism (heater) for applying heat to the wafer W. When the tester 15 inspects the electrical characteristics of the electronic device, the wafer W may be heated to a desired temperature. Further, the chuck top 15B may have a cooling mechanism (chiller) for cooling the chuck top 15B with a cooling liquid.

The transfer stage 18 is an example of a transfer mechanism. The transfer stage 18 can move within the transfer area 13 in the X direction along the rail 18A. The transfer stage 18 has an arm or the like that can operate in the Y direction and the Z direction, and can transfer the wafer W or the like in the X direction, the Y direction, and the Z direction. The transfer stage 18 receives the wafer W from the port 17a of the load port area 14, transfers the wafer W in the transfer area 13 in the X direction, and delivers the wafer W to the aligner 19. Further, the transfer stage 18 receives from the aligner 19 the wafer W for which the inspection of the electrical characteristics of the electronic device has been completed, transfers the wafer W in the transfer area 13 in the X direction, and delivers the wafer W to the port 17a.

The aligner 19 receives the wafer W from the transfer stage 18. The aligner 19 transports the chuck top 15B holding the wafer W to each tester 15 and aligns the wafer W with respect to the probe card held by the pogo frame 15A. In a state in which such alignment has been performed, the chuck top 15B is attracted onto the pogo frame 15A by a vacuum suction mechanism (not shown). The aligner 19 receives, from the pogo frame 15A, the chuck top 15B holding the wafer W for which the inspection of the electrical characteristics of the electronic device has been completed, and delivers the wafer W to the transfer stage 18.

Figure 3:
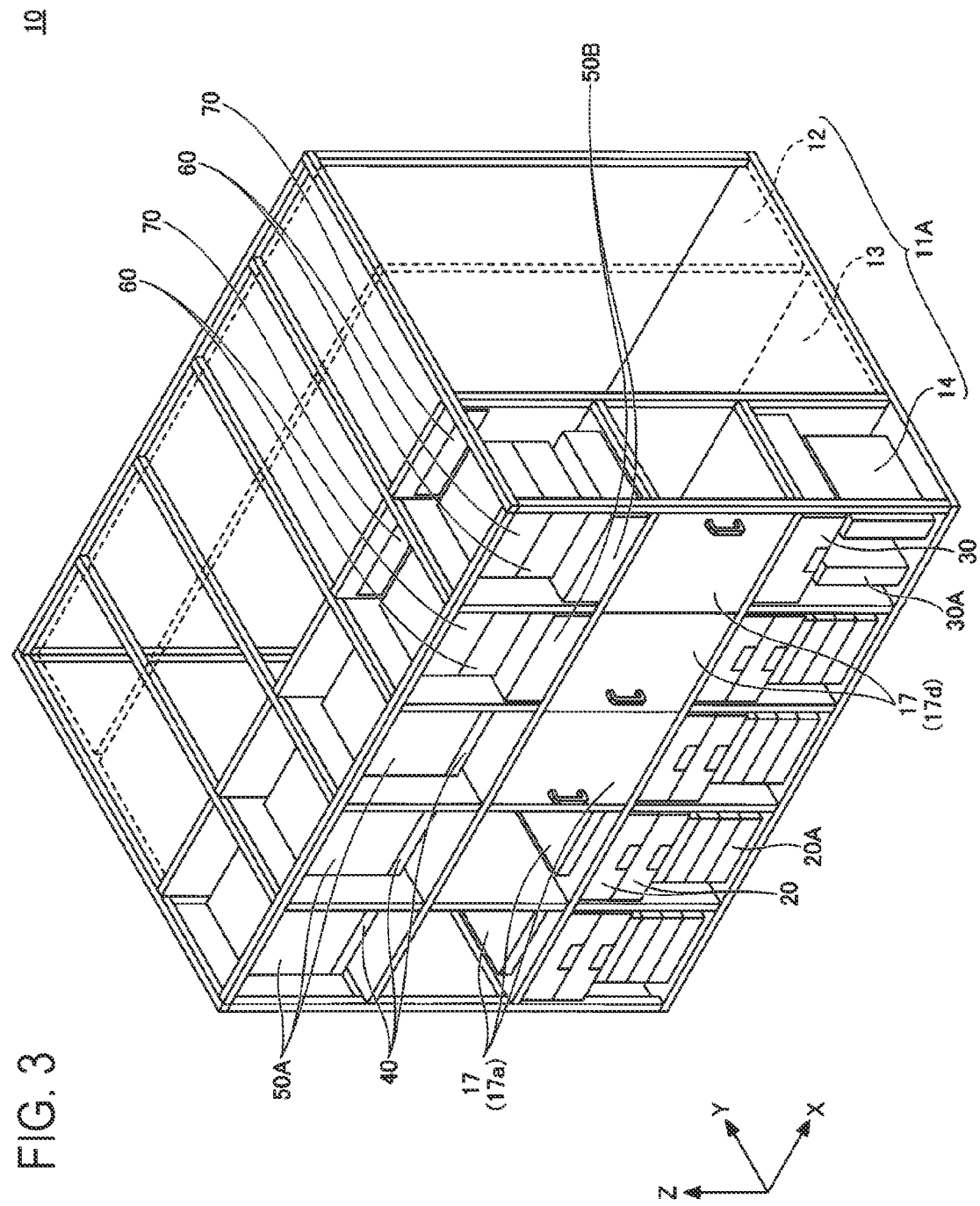
FIG. 3 is a diagram showing the inspection apparatus from a load port area side.

FIG. 3 is a diagram showing the inspection apparatus 10 from the load port area 14 side. In FIG. 3, constituent elements accommodated in the inspection area 12 and the transfer area 13 are not shown. As an example, the load port area 14 is partitioned into fifteen accommodation spaces 17. The fifteen accommodation spaces 17 are partitioned into five rows in the X direction and three stages in the vertical direction. In the following, the accommodation spaces 17 in the five rows in the X direction are referred to as the first to fifth row accommodation spaces 17 from the −X direction side to the +X direction side. Further, the three-stage accommodation spaces 17 in the vertical direction are referred to as a lower stage (first stage from the bottom) accommodation space 17, a middle stage (second stage from the bottom) accommodation space 17, and an upper stage (third stage from the bottom) accommodation space 17 in order from the bottom.

In the five accommodation spaces 17 at the middle stage, three ports 17a and two controllers 17d are disposed, as in the configuration shown in FIG. 1. Among these, the accommodation spaces 17 in which one port 17a and two controllers 17d are disposed are show a state in which an operable door is closed.

Eight card slots 20 and four devices 20A are disposed in the first to fourth row accommodation spaces 17 at the lower stage. That is, the eight card slots 20 are disposed at a stage lower than that of the port 17a. In each of the first to fourth rows of the accommodation spaces 17 at the lower stage, two of the eight card slots 20 are overlap each other and placed on a device 20A.

The eight card slots 20 are an example of a plurality of probe card accommodation parts, together with four card buffers 60. Further, the eight card slots 20 are an example of a plurality of first probe card accommodation parts among the plurality of probe card accommodation parts. The number of card slots 20 disposed under the port 17a is not limited to eight, but may be at least one.

Each of the card slots 20 is a container for accommodating a probe card in a state where the probe card is placed on a middle plate. A user of the inspection apparatus 10 can load the probe card onto the middle plate from the outside of the inspection apparatus 10 on the −Y direction side and unload the probe card placed on the middle plate. The devices 20A are devices that perform the functions of the card slot 20, and are, for example, a heater, a cooling mechanism, a vacuum suction mechanism, and the like.

The transfer stage 18 can load/unload the middle plate on which the probe card is placed from the +Y direction side of the card slot 20. FIG. 3 shows a state in which the lid on the −Y direction side of the card slot 20 is closed. The probe card and the middle plate will be described later with reference to FIG. 4.

Further, a wafer table 30 and a device 30A are disposed in the accommodation space 17, which is on the fifth row at the lower stage. The wafer table 30 is used when one wafer W is loaded into the inspection apparatus 10 without going through a carrier such as FOUP. The device 30A is a device used to perform the functions of the wafer table 30 or constituent elements other than the wafer table 30 that are included in the inspection apparatus 10.

One card buffer 40 and one power control device 50A are disposed in each of the first to third row accommodation spaces 17 at the upper stage. The power control device 50A is placed on the card buffer 40.

The card buffer 40 is a container for accommodating a probe card in a state where the probe card is placed on the middle plate. Although the probe card cannot be loaded in or unloaded from the inspection apparatus 10, the transfer stage 18 can load or unload the middle plate, on which the probe card is placed, in or from the −Y direction side of the card buffer 40.

The power control device 50A is a device that adjusts electric power supplied from the outside of the inspection apparatus 10 and may have, for example, a breaker switch that can be operated from the outside of the inspection apparatus 10. Instead of the power control device 50A, a device other than the power control device 50A may be provided in the inspection apparatus 10.

One power control device 50B and two card buffers 60 are arranged to overlap each other in each of the accommodation spaces 17 at the fourth and fifth rows of the upper stage. As an example, the card buffers 60 overlap each other on the power control device 50B.

The power control device 50B may be the same device as the power control device 50A. Further, the power control device 50B may be a power control device of a different type from the power control device 50A, and a device other than the power control device 50B may be provided in the inspection apparatus 10, instead of the power control device 50B.

Like the card buffer 40, each of the card buffers 60 is a container for accommodating a probe card in a state in which the probe card is placed on the middle plate, and the number of card buffers is four in total. Along with the eight card slots 20, the four card buffers 60 are an example of a plurality of probe card accommodation parts. Further, the four card buffers 60 are an example of the remaining plurality of second probe card accommodation parts among the plurality of probe card accommodation parts. Here, a mode in which the inspection apparatus 10 includes the four card buffers 60 will be described, but the inspection apparatus 10 may include at least one card buffer 60.

The probe card cannot be loaded or unloaded in or from the card buffer 60 from the outside of the inspection apparatus 10, but the transfer stage 18 can load or unload the middle plate, on which the probe card is placed, from the +Y direction side of the card buffer 60. An opening 70 for connecting the load port area 14 and the transfer area 13 is formed on the +Y direction side of the card buffer 60.

As an example, the card buffer 60 is different from the card buffer 40 in that the card buffer 60 is an add-on type (which can later be provided) card buffer, and is provided in an empty space above the power control device 50B. The card buffer 60 is disposed at a location higher than the port 17a, and the card buffer 60 and the card slot 20 are disposed above and below the port 17a.

As an example, description will be given with the assumption that the card buffers 40 are provided in the accommodation spaces 17 at the first to third rows in the upper stage when the inspection apparatus 10 is manufactured and the card buffer 60 is added after the manufacture of the inspection apparatus 10. However, the card buffer 60 may be provided during the manufacture of the inspection apparatus 10.

The space where the card buffer 60 can be added after the manufacture of the inspection apparatus 10 is, as an example, only a space above the power control device 50B of the accommodation spaces 17 at the fourth and fifth rows in the upper stage of the inspection apparatus 10. Therefore, the card buffer 60 is disposed on the power control device 50B. The position of the card buffer 60 corresponds to a position where the arm of the transfer stage 18 can reach.

Here, the mode in which the card buffer 60 is provided in an empty space above the power control device 50B is described, but the card buffer 60 may be provided in any empty spaces as long as the arm of the transfer stage 18 can reach the empty place in the housing 11 of the inspection apparatus 10. For example, if there is an empty space in the inspection area 12 where the arm of the transfer stage 18 can reach, the card buffer 60 may be placed in that empty space. The card buffer 60 may be disposed in the inspection area 12 and/or the load port area 14.

Figure 4:
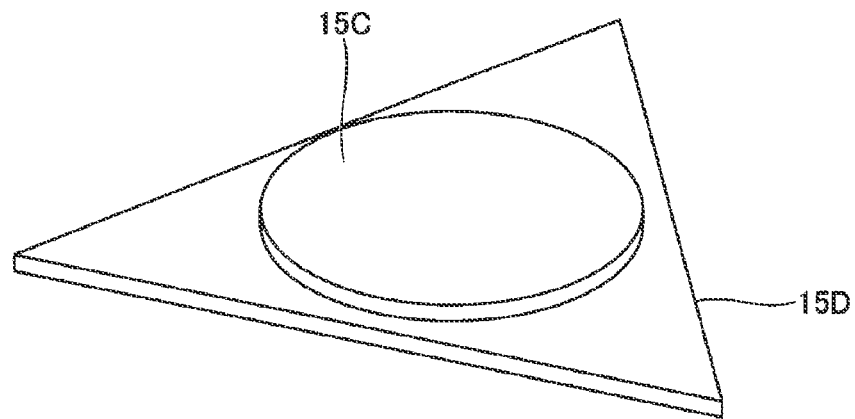
FIG. 4 shows a probe card and a middle plate.

FIG. 4 shows a probe card 15C and a middle plate 15D. The probe card 15C is a disc-shaped member and has a plurality of probes (not shown) that come into contact with a plurality of terminals of an electronic device formed on the wafer W. In FIG. 4, the probes are on the lower surface side of the probe card 15C.

As an example, the middle plate 15D is a triangular plate-shaped member in a plan view, and the probe card 15C is placed on the upper surface of the middle plate 15D. The middle plate 15D is a transfer plate used when the probe card 15C is transported, and protects the probes during the transfer.

Figure 5:
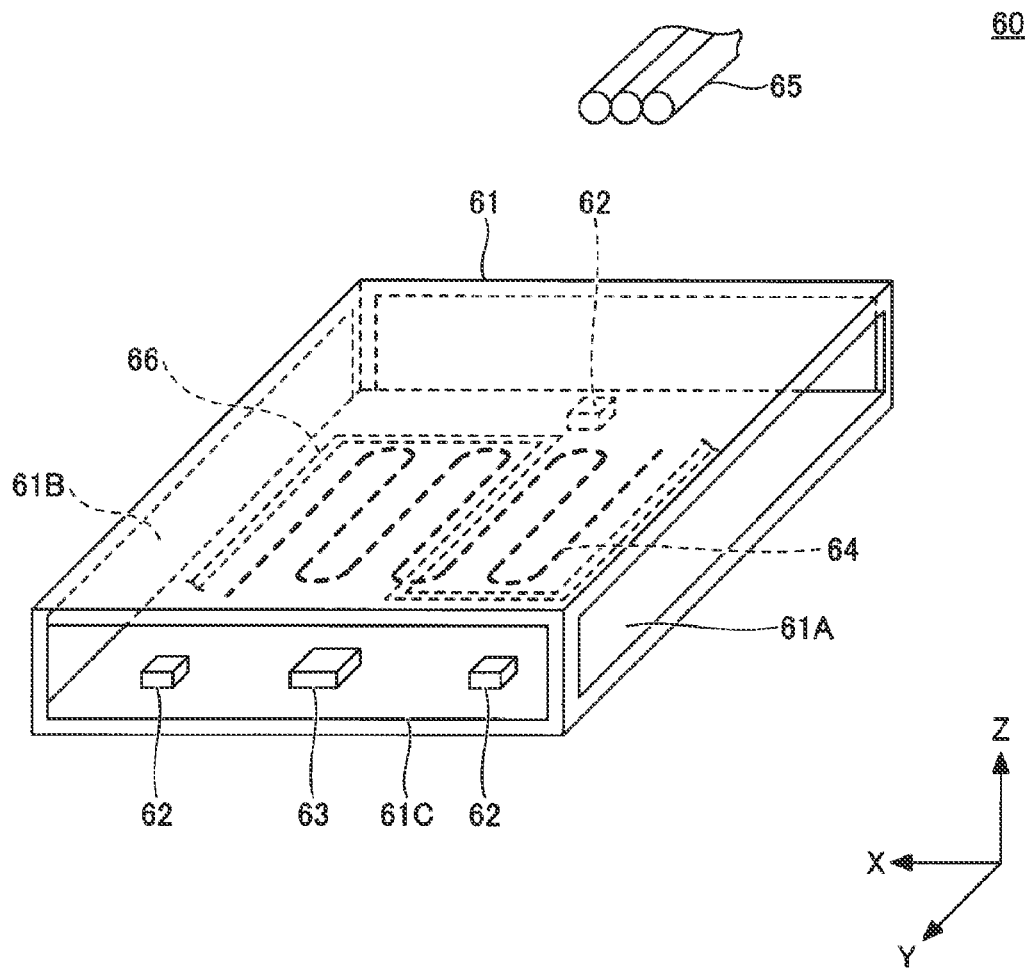
FIG. 5 depicts a card buffer.

FIG. 5 depicts a card buffer 60. In FIG. 5, the back side facing the side of the opening 70 in FIG. 3 is shown as the front side. The card buffer 60 has, for example, a frame 61, a sensor 62, a sensor 63, a heater 64, a blower 65, and a flow path 66.

The frame 61 has a bottom plate 61A, a ceiling plate 61B, and openings 61C and, as an example, is made of metal and/or resin. The bottom plate 61A is a rectangular plate-shaped portion (in a plan view) that becomes the bottom of the frame 61. Like the bottom plate 61A, the ceiling plate 61B is a rectangular plate-shaped portion in a plan view and is located above the bottom plate 61A. The four openings 61C are formed between the bottom plate 61A and the ceiling plate 61B so as to face all directions.

The middle plate 15D on which the probe card 15C is placed is transferred to the inside of the frame 61 by the transfer stage 18 via the opening 61C on the +Y direction side. As an example, the middle plate 15D is disposed on the upper surface of the bottom plate 61A in a manner that three points are supported. In this case, three support portions (for example, protrusions) may be provided on the upper surface of the bottom plate 61A, or three support portions (for example, protrusions) may be provided on the lower surface of the middle plate 15D.

Three sensors 62 are disposed on the upper surface of the bottom plate 61A. Two of the three sensors 62 are disposed at an end portion of the +X direction side on the +Y direction side and an end portion of the −X direction side on the +Y direction side, respectively, and the remaining one is disposed in the central portion of the X direction on the −Y direction side.

Each of the sensors 62 is used to determine a position of the middle plate 15D. The controller 17d of the inspection apparatus 10 (see FIGS. 1 and 3) determines whether or not the middle plate 15D is in the correct position in the frame 61, based on the output of the sensor 62, and controls the transfer stage 18 to move the middle plate 15D to the correct position. The arrangement of the three sensors 62 shown in FIG. 5 is an example and they may be disposed at any position as long as it can be detected whether or not the middle plate 15D is in the correct position in the frame 61.

An example of such a sensor 62 may include an optical sensor that detects the transmission or reflection of light output by an optical output device such as an LED (Light Emitting Diode), a sensor that detects physical contact such as a limit switch, or the like.

The sensor 63 is provided in the central portion of the X direction on the +Y direction side of the upper surface of the bottom plate 61A. The sensor 63 is used to detect whether or not the middle plate 15D is inside the frame 61. The controller 17d (see FIGS. 1 and 3) of the inspection apparatus 10 determines whether or not the middle plate 15D is inside the frame 61, based on the output of the sensor 63. An example of the sensor 63 may include an optical sensor that detects transmission or reflection of light output by an optical output device such as an LED, a limit switch, or the like.

The heater 64 is an example of a heating device and is, as an example, buried in the bottom plate 61A of the frame 61. The heater 64 is, as an example, a heating wire, and the temperature thereof is regulated by the controller 17d (see FIGS. 1 and 3) of the inspection apparatus 10. By heating the middle plate 15D, on which the probe card 15C is placed, with the heater 64, the probe card 15C can be heated to a desired temperature in advance in the card buffer 60, before inspecting the electrical characteristics of the electronic device formed on the water W. The heater 64 may be one other than the heating wire.

The blower 65 is an example of a dry air supplying device and is, as an example, disposed on the −Y direction side of the frame 61. The blower 65 is connected to a dry air supplying source (not shown) and is driven and controlled by the controller 17d (see FIGS. 1 and 3) of the inspection apparatus 10 to inject dry air into the frame 61. The blower 65 is provided to remove dust and the like adhering to the probe card 15C placed on the middle plate 15D. This can prevent poor contact of the probe due to dust or the like. The reason for injecting dry air is to prevent dew condensation when the cooling temperature of the probe card 15C is particularly low.

The flow path 66 is an example of a cooling device and is buried in the bottom plate 61A. The flow path 66 is connected to a coolant supply source that supplies a coolant such as a cooling liquid, and the flow rate of the coolant is adjusted by the controller 17d (see FIGS. 1 and 3) of the inspection apparatus 10. By cooling the middle plate 15D on which the probe card 15C is placed with the coolant in the flow path 66, the probe card 15C can be cooled to a desired temperature in advance in the card buffer 60, before performing the inspection of the electrical characteristics of the electronic device formed on the wafer W.

Further, the card buffer 60 may include any one or two of the heater 64, the blower 65, and the flow path 66, or may not include the heater 64, the blower 65, and the flow path 66.

Since the inspection apparatus 10 as described above includes fifteen testers IS, there are fifteen probe cards 15C. By a vacuum suction mechanism (not show each of the probe card 15C is attached onto the pogo frame 15A (see FIG. 2), which is fixed to the housing 11.

Since the inspection apparatus 10 includes the eight card slots 20, the three card buffers 40, and the four card buffers 60, the inspection apparatus 10 can accommodate all of the fifteen probe cards.

For example, when the inspection apparatus 10 is powered off, as a preliminary preparation, the chuck top 15B is retracted to a predetermined place by the aligner 19 while the vacuum suction of the chuck top 15B is released at each stage of the inspection area 12. When the inspection apparatus 10 is powered on again, the chuck top 15B is moved from the retracted position to a location under the pogo frame 15A by the aligner 19. Then, a mark on the back surface of the chuck top 15B is recognized by a camera of the aligner 19 to align the chuck top 15B, and the pogo frame 15A is attached by vacuum-suction.

Further, when the inspection apparatus 10 is powered off, as a preliminary preparation, the chuck top 15B is retracted at each stage of the inspection area 12, and then the aligner 19 recovers the probe cards 15C and transfers them to the transfer stage 18. The transfer stage 18 sequentially accommodates the probe cards 15C in any one of the eight card slots 20, the three card buffers 40, and the four card buffers 60. Therefore, all of the fifteen probe cards 15C can be accommodated in the eight card slots 20, the three card buffers 40, and the four card buffers 60. The total number of the card slots 20, the card buffers 40, and the card buffers 60 may be greater than the number of probe cards 15C, For example, five card buffers 60 may be included so that one card buffer 60 may be used as a spare.

For example, when the four card buffers 60 are not included, the probe cards 15C having no accommodation destination are recovered before the inspection apparatus 10 is powered off. Since the recovery of probe cards 15C is performed manually by a user, a relatively long work time is required. Furthermore, when there is a plurality of inspection devices 10, the work time becomes enormous.

Further, if it takes a long time for the manual work after the vacuum-attraction is released, the probe card 15C may fall, which may cause damage to the probe card 15C.

In contrast, in the inspection apparatus 10 in which the four card buffers 60 are added, it is not necessary to manually recover the probe cards because there is an accommodation place for all the probe cards 15C. Therefore, the inspection apparatus 10 can be powered off in a relatively short time. Further, when the power is off and then on again, it can be restored in a relatively short time.

For example, when the inspection apparatus 10 is powered off to check the power once every few months, the time required to turn off the power of the inspection apparatus 10 and the time required to turn the power of the inspection apparatus 10 back on can be shortened, allowing the inspection to be performed efficiently, when viewed overall.

Therefore, it is possible to provide an inspection apparatus 10 capable of performing inspection with efficiency.

Further, since the card slot 20 and the card buffer 60 are disposed above and below the port 17a, the transfer stage 18 moves mainly in the vertical direction when the wafer W is transported between the port 17a and the card slot 20 or the card buffer 60, so that the transfer time can be shortened.

Therefore, it is possible to provide an inspection apparatus 10 capable of performing inspection with high throughput.

In addition, the card slots 20 overlap one another, each having two card slots 20, and the card buffers 60 overlap one another, each having two card buffers 60. By arranging the card slots 20 and the card buffers 60 to overlap each other, it is possible to provide the inspection apparatus 10 having a small footprint.

Further, since the card buffer 60 has the heater 64, when the temperature of the probe card is preheated to a desired temperature with the heater 64 before the probe card is transferred from the accommodation place to beneath the tester 15 by turning the power on again, the inspection of the electrical characteristics of the electronic device formed on the wafer W can be started quickly. Therefore, it is possible to provide the inspection apparatus 10 capable of inspecting with high throughput.

Further, since the card buffer 60 has the blower 65 for injecting thy air, it is possible to prevent poor contact of the probe due to dust or the like and the occurrence of dew condensation, thereby making it possible to inspect with high throughput.

Further, since the card buffer 60 has the flow path 66 through which the coolant can flow, when the temperature of the probe card is pre-cooled to a desired temperature with the coolant the flow path 66 before the probe card is transferred from the accommodation place to beneath the tester 15 by turning the power on again, the inspection of the electrical characteristics of the electronic device formed on the wafer W can be started quickly. Therefore, it is possible to provide the inspection apparatus 10 capable of inspecting with high throughput.

Further, since a plurality of testers 15 are disposed in the inspection area 12 along the X direction, and the inspection area 12, the transfer area 13, and the load port area 14 are disposed along the Y direction, the inspection area 12 and the load port area 14 are located in both sides of the transfer area 13. Thus, the inspection can be performed efficiently.

According to the present disclosure in some embodiments, it is possible to perform inspection with efficiency.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An inspection apparatus comprising:
a load port area in which a carrier accommodation chamber for accommodating a carrier that receives an inspection object is disposed;
an inspection area in which a plurality of probe cards are respectively disposed under a plurality of inspection devices, and in which the probe card is pressed against an electronic device of the inspection object on a chuck top to inspect the electronic device;
a transfer area in which a transfer mechanism transfers the inspection object onto the chuck top, the transfer area being disposed between the load port area and the inspection area in a plan view; and
a plurality of probe card accommodation devices disposed in at least one of the load port area or the inspection area, each probe card accommodation device being capable of accommodating the probe card, and a number of the probe card accommodation devices being equal to or greater than a number of the probe cards,
wherein one or multiple first probe card accommodation devices among the plurality of probe card accommodation devices, and a remaining one or multiple second probe card accommodation devices among the plurality of probe card accommodation devices are vertically disposed in the load port area with the carrier accommodation chamber therebetween, and
wherein the inspection apparatus further comprises, in at least one of the one or the multiple first probe card accommodation devices or the one or the multiple second probe card accommodation devices, at least one of a dry air supplying device configured to supply dry air to a probe card being accommodated therein, a heating device configured to apply heat to the probe card being accommodated therein, or a cooling device configured to cool the probe card being accommodated therein.

2. The inspection apparatus of claim 1, wherein the multiple first probe card accommodation devices are disposed to overlap each other.

3. The inspection apparatus of claim 2, wherein the multiple second probe card accommodation devices are disposed to overlap each other.

4. The inspection apparatus of claim 3, wherein:
the plurality of inspection devices are disposed in the inspection area along a first axial direction in a plan view, and
the load port area, the inspection area, and the transfer area are disposed along a second axial direction in the plan view.

5. The inspection apparatus of claim 1, wherein the multiple second probe card accommodation devices are disposed to overlap each other.

6. The inspection apparatus of claim 1, wherein:
the plurality of inspection devices are disposed in the inspection area along a first axial direction in a plan view, and
the load port area, the inspection area, and the transfer area are disposed along a second axial direction in the plan view.

* * * * *